United States Patent [19]

Price et al.

[11] Patent Number: 4,675,553
[45] Date of Patent: Jun. 23, 1987

[54] SEQUENTIAL LOGIC CIRCUITS IMPLEMENTED WITH INVERTER FUNCTION LOGIC

[75] Inventors: John E. Price, Palo Alto; Larry W. De Clue, Saratoga, both of Calif.

[73] Assignee: Amdahl Corporation, Sunnyvale, Calif.

[21] Appl. No.: 588,918

[22] Filed: Mar. 12, 1984

[51] Int. Cl.[4] .................. H03K 19/086; H03K 19/20; H03K 3/037; H03K 3/289

[52] U.S. Cl. .................................. 307/455; 307/454; 307/272 R; 307/272 A; 307/289

[58] Field of Search ............... 307/440, 445, 454, 446, 307/455, 467, 272 R, 272 A, 289

[56] References Cited

U.S. PATENT DOCUMENTS

| | | | |
|---|---|---|---|
| 3,467,839 | 9/1969 | Miller | 307/455 X |
| 4,145,623 | 3/1979 | Doucette | 307/467 X |
| 4,276,488 | 6/1981 | Benedict et al. | 307/455 X |
| 4,349,753 | 9/1982 | Scavuzzo | 307/455 X |
| 4,399,377 | 8/1983 | Jones | 307/467 X |
| 4,513,283 | 4/1985 | Leininger | 307/455 X |
| 4,532,440 | 7/1985 | Barre | 307/455 |
| 4,540,900 | 9/1985 | Early et al. | 307/455 X |

FOREIGN PATENT DOCUMENTS 148427   9/1982   Japan .................. 307/455

OTHER PUBLICATIONS

Blumberg et al, "High-Speed Glitchless Cascade Latch with Set"; IBM-TDB; vol. 18, No. 5, pp. 1415-1416; 10/1975.

*Primary Examiner*—Larry N. Anagnos
*Attorney, Agent, or Firm*—Fliesler, Dubb, Meyer & Lovejoy

[57] ABSTRACT

Sequential logic circuits are implemented with inverter function logic gates. In each circuit, level shifted transistor means are utilized in place of the standard reference transistors found in ECL gate circuits so that the complement of at least one of the input signals may be included in the logical operation performed by the sequential logic circuit. The complementary clock signal is thus not required as a separate input. Sequential logic functions thus implemented have fewer gates, less complex clock drivers, consume less power and have shorter propagation delay.

6 Claims, 24 Drawing Figures

IN-PHASE LATCH $Z = (D+C)(Z_T \overline{C})$

PRIOR ART

OUT OF PHASE LATCH

$\overline{Z} = \overline{(D + C)} + \overline{(Z + \overline{C})}$
$\phantom{\overline{Z}} = (D + C) + (Z + \overline{C})$
$\phantom{\overline{Z}} = CD + \overline{C}Z$

PRIOR ART

FIG.-10a $C$ -0.9V / -1.7V
FIG.-10b $C'$ -1.3V / -2.5V
FIG.-10c $\overline{D}$ -0.9V / -1.7V
FIG.-10d $Z$ -0.9V / -1.7V

LATCH WITH SCAN - IN, SCAN - OUT $Z = \overline{(C+D)(C+R+Z)(SID+SA1+SA2)}$ $SOD = \overline{Z + SA1 + SA2}$

| MODE | SA1,SA2 | R | SID | D | C | Z | SOD |
|---|---|---|---|---|---|---|---|
| HOLD | 0 | 0 | — | — | 0 | Z | 0 |
| SAMPLE | 0 | 0 | — | 0 | 1 | 1 | 0 |
|  | 0 | 0 | — | 1 | 0 | 0 | 0 |
| RESET | 0 | 1 | — | — | 0 | 0 | 0 |
| SCAN-IN | 1 | 0 | 1 | — | 0 | 1 | 1 |
| SCAN-OUT | 1 | 0 | 0 | — | 0 | Z | Z |

FIG. — 14

MASTER/SLAVE LATCH

PRIOR ART

GLITCH FREE LATCH

SEQUENTIAL LOGIC CIRCUITS IMPLEMENTED WITH INVERTER FUNCTION LOGIC

BACKGROUND OF THE INVENTION

1. Field of the Invention

This invention relates to sequential logic circuits implemented in a particular bipolar logic family and, more particularly, relates to sequential logic functions such as flip-flops or latches which are implemented with inverter function logic gates.

2. Discussion of Background and Prior Art

Digital computers utilize both combinational and sequential logic circuits in their processing units. Combinational logic circuits perform a preset logical operation upon variable inputs and produce an immediate output of the results. The combinational logic functions are implemented with particular ones of the available integrated circuit logic gates of the types which are available with one of the popular logic families such as transistor-transistor logic, emitter-coupled logic, resistor-transistor logic or are implemented with particularized logic gates such as those disclosed in Z. E. Skokan, "Logic Gate", U.S. Pat. No. 3,643,109. See generally D. A. Hodges et al., *Analysis and Design of Digital Integrated Circuits*, Chapter 7, "Bipolar Digital Gate Circuits", (McGraw-Hill 1983); and H. W. Gschwind et al., *Design of Digital Computers*, pp. 64–100. Combinational logic circuits which are implemented in inverter function logic are disclosed in the copending U.S. application Ser. No. 06/588,919 of Price et al., "Combinational Logic Circuits Implemented With Inverter Function Logic", filed on even date herewith.

Sequential logic circuits perform the function of storing previous input information. They retain a state which is set up by the most recently received data. As basic flip-flops or as latches they, too, are fabricated from available integrated circuit logic gates or are implemented with particularized logic gates, as described above. In a typical digital computer, integrated circuit logic gates based on various logic families may be utilized, especially if they are available off the shelf. Where customized circuits are fabricated, due to process limitations or to the desire to simplify the interconnection schemes, it is at times desirable to utilize a single logic family when implementing both combinational and sequential logic circuits. Such a universal logic gate having unique properties and based upon a variation of ECL logic is disclosed in the co-pending U.S. application Ser. No. 06/588,476 of J. E. Price and L. W. DeClue, "Inverter Function Logic Gate", filed on even date herewith and now as U.S. Pat. No. 4,605,871. Briefly, an individual inverter function logic gate is capable of performing logical operations on the complement of one or more of the input variables without having to use a discrete inverter to produce the complementary value. Such individual inverter function logic gates may be combined to fabricate sequential logic circuits which have preferential properties over prior art sequential logic circuits.

Sequential logic circuits include flip-flops, latches and registers. The logical operation of sequential logic circuits is well known. See, e.g., H. W. Gschwind et al, *Design of Digital Computers*, Chapter 5, "Storage Elements", pp. 122–154. Sequential logic circuits may be implemented generally by means based upon various types of physical effects. Thus, mechanical, electrical, magnetic, optical, acoustic, or cyrogenic means may be used; molecular and atomic effects may also be used. Electrical implementation and particularly implementation with integrated circuits fabricated with bipolar logic of inverter function logic, as described below, is contemplated in the present invention.

Figure 11:
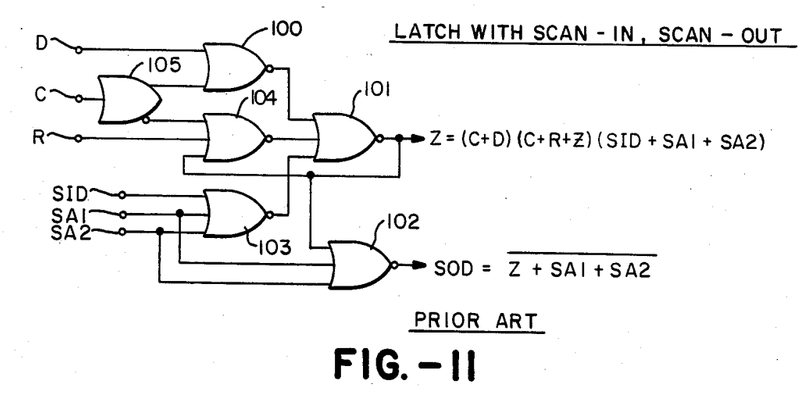
FIG. 11 is the logic diagram of a latch with a Scan-in, Scan-out property as implemented with ECL logic gates.
Figure 12:
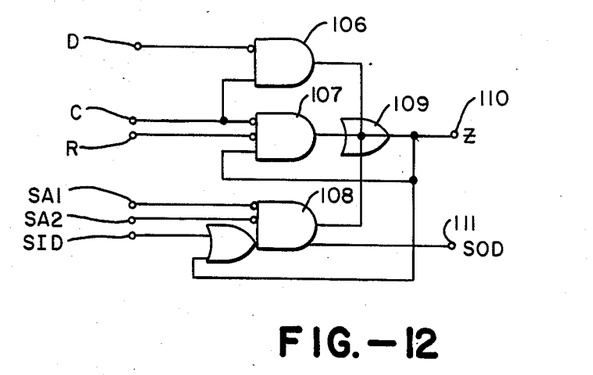
FIG. 12 is a latch with Scan-in, Scan-out as implemented with IFL gates.

When sequential logic circuits are implemented in an integrated circuit format they are based on one or more of the basic bipolar logic families. For high performance digital computers and other applications where high speed products are desired, the logic family of choice would likely be emitter-coupled logic. Latches implemented in emitter-coupled logic are shown, for example, in the prior art FIGS. of 3, 7, 11 and 15. In these figures of prior art devices the C input line designates the clock input and the D input line designates the data input. It is the previous state of D that is stored so that no other inputs are required, except for R which signifies reset, as shown in FIG. 12. For conventional ECL-based latches the complement of the clock has to be generated in order to permit the latch operation to be performed; this typically requires the use of a separate OR/NOR gate such as gate 70 in FIG. 7 or gate 105 in FIG. 11. Also, the number of individual gates required for ECL-based sequential logic circuits may be undesirably high.

BRIEF DESCRIPTION OF THE DRAWINGS

For a more complete understanding of the sequential function logic gates of the present invention, reference may be had to the accompanying drawings which are incorporated herein by reference and in which:

FIG. 9 is the circuit schematic of the IFL-based Out-of-Phase Latch circuit of FIG. 8a;

SUMMARY OF THE INVENTION

Sequential logic circuits are implemented with inverter function logic gates. In each circuit, level shift transistor means are utilized in place of the standard reference transistors found in ECL gate circuits so that the complement of at least one of the input signals may be included in the logical operation performed by the sequential logic circuit. In a preferred embodiment this input signal is the clock signal so that both C and $\overline{C}$ are included in the logical operation. Sequential logic functions thus implemented have fewer gates, less complex clock drivers, less power consumption and shorter propagation delay.

DESCRIPTION OF THE PREFERRED EMBODIMENTS

Sequential logic circuits have the property that they retain the state introduced by the last input received. Sequential logic functions with the lowest delay-power product are made available by using emitter-coupled logic (ECL) gates. See, e.g., the Advanced Micro Devices 10-Bit Latch, Am29841 or the Advanced Micro Devices Octal D-Type Flip-Flop, Am8120. When sequential function logic gates are implemented in ECL logic they often require an undesirable numbers of gates, complex clocking circuitry and diode clamps when collector dotting is utilized. Due to the symmetry of inverter function logic gates, as described below, many of the disadvantages of prior art implementations of sequential logic circuits are avoided.

Figure 1:
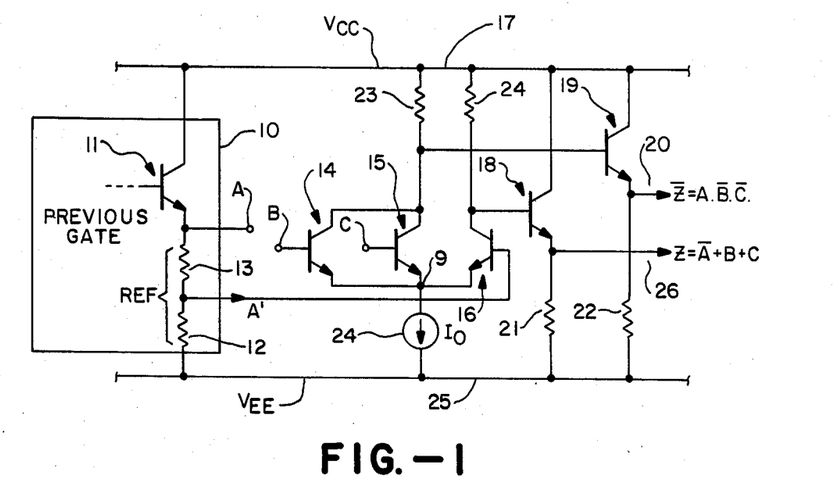
FIG. 1 is a simple combinational logic circuit illustrating one embodiment of an individual inverter function logic gate.
Figure 2:
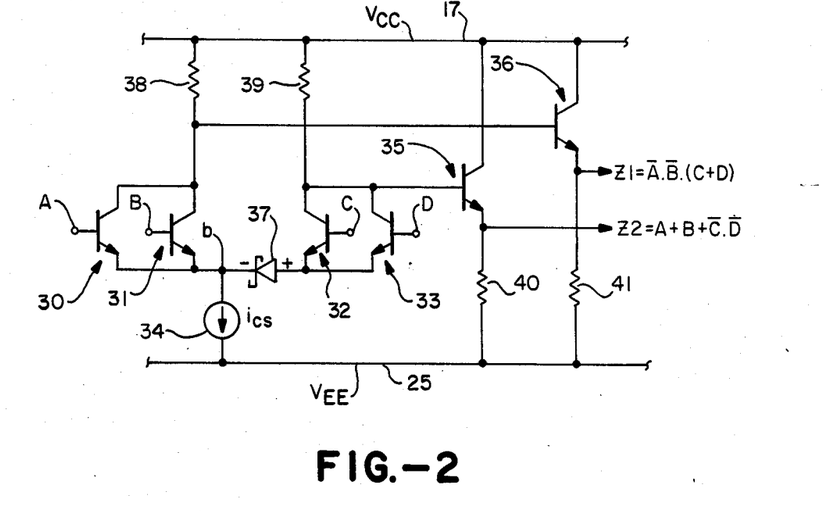
FIG. 2 is another simple combinational logic circuit illustrating another embodiment of an individual inverter function logic gate.

The structure and operation of inverter function logic gates is disclosed and claimed in the co-pending application of J. E. Price and L. W. DeClue, "Inverter Function Logic Gate", filed on even date herewith. As shown in FIGS. 1 and 2, the inverter function logic gate principle may be used to perform simple combinational logic functions. In principle, an individual inverter function logic gate performs a logical operation upon the complement of at least one input signal as well as upon the other ones of the input signals. This is accomplished by utilizing a level shifted input means in lieu of the standard reference transistor found in ECL gates. Thus, input signals are compared with each other rather than with a reference signal in the performance of the logical operation. The input signal whose complement is to be included in the logical operation is shifted by the level shift transistor means. The other input signals are applied to the bases of separate input transistors as are found in conventional ECL OR/NOR gates. In the embodiment shown in FIG. 1, a level shifted representation A′ of an input A is obtained from the previous gate 10 by dividing the voltage (the voltage level of A) available on the emitter of output transistor 11 between a resistor 13 and a resistor 12. This division is shown as occurring within the previous gate, although it is preferably done close to the transistor on which it is used to avoid the delay due to the RC time constant from the capacitance of the transmission line between previous gate 10 and the base of level shift input transistor 16 multiplied by the resistance of resistor 13. This level shifted representation is introduced on the base of level shift input transistor 16 which in this embodiment comprises the level shifted input means. The inputs B and C are provided, respectively, at the standard ECL voltage levels for two-valued Boolean logic to the bases of transistors 14 and 15. The outputs $\overline{Z} = A.\overline{B}.\overline{C}$ and $Z = \overline{A} + B + C$ appear on output terminals 20 and 26, which are, respectively, the emitters of output transistors 19 and 18.

An alternate embodiment of the individual IFL gate is incorporated in the combinational logic circuit of FIG. 2. Here, the level shifted transistor means comprises transistors 32 and 33 in combination with Schottky diode 37. The inputs C, D provided to the bases of transistors 32 and 33 are at the conventional ECL levels. However, whenever current is steered through transistors 32 or 33, the Schottky diode 37 shifts the voltage available on the emitters by an amount of approximately 0.4 volts. The level at node a in FIG. 1 is equal to the level at node b in FIG. 2 for an input A of the same value as an input C or D. The IFL circuit principles shown in FIGS. 1 and 2 may be used interchangeably as building blocks for producing the sequential logic circuits of the present invention. The choice of which embodiment to use is likely to be based on process considerations and secondarily on circuit design principles.

The advantageous features of inverter function logic (IFL) gates for use in sequential logic circuits will be shown and described in connection with specific latch circuits. In each case the input lines designated D are for the Data input and the input lines designated C are for the Clock input. In the IFL circuit schematics the lines designated C′ are for the level shifted representations of the level C, as discussed with respect to the operation of IFL circuits herein; they do not represent the complement of the clock, $\overline{C}$ which are generated internally within the ECL embodiments and are not specifically labelled. For each latch example, the prior art logic diagram is given, the IFL logic diagram is given, the IFL-based circuit schematic is given and either timing diagrams of the voltages of critical nodes in the IFL-based circuit or a truth table describing the operation of the IFL-based circuit are given. By comparing the ECL-based logic diagrams of prior art latches with the IFL-based logic diagrams and circuit schematics, the saving of gates will be evident. The function of these latches and typical applications are not given as they are well known in the art. See, e.g., H. W. Gschwind et al., *Design of Digital Computers*, "Storage Elements", Chapter 5, pp. 122–154 (Springer-Verlag 1975).

In-Phase Latch Circuit

Figure 3:
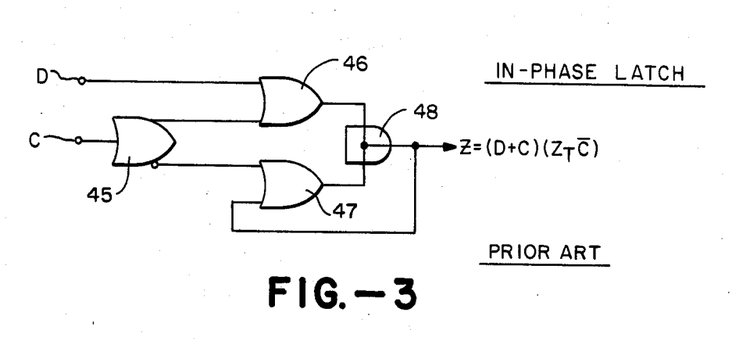
FIG. 3 is a logic diagram of an In-Phase Latch circuit fabricated with ECL logic gates.
Figure 4:
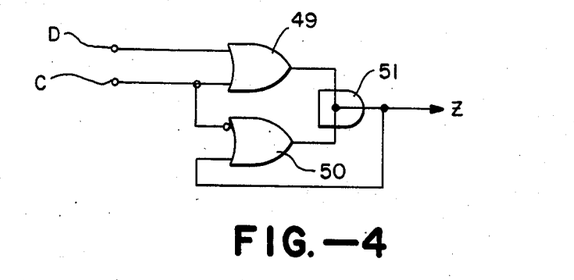
FIG. 4 is a logic diagram of an In-Phase Latch circuit implemented with inverter function logic (IFL) gates.
Figure 5:
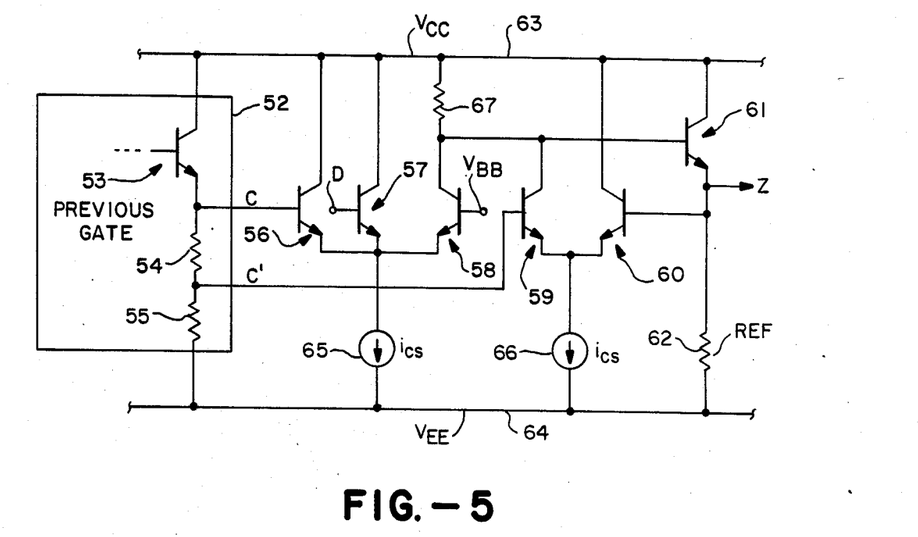
FIG. 5 is the circuit schematic of the IFL-based In-Phase Latch logic diagram of FIG. 4.

An In-Phase Latch circuit implemented in ECL logic is shown in FIG. 3. With a data input D and a clock input C the logical output Z is given by $Z=(D+C)(Z+\overline{C})$. In operation, OR gate 46 ORs the inputs D and C, the OR gate 47 ORs $\overline{C}$ and Z, and AND gate 48 ANDs the two OR'd terms. The OR gate 45 takes the clock input C and produces C and $\overline{C}$ on its output; as described above, the generation of the complement of the clock signal is a requirement for all ECL based sequential logic circuits. To perform the function with ECL logic three OR gates 45, 46 and 47 are required as well as one AND gate 48. When the function is implemented in IFL logic, one OR gate is eliminated, the gate which produces the complement $\overline{C}$ of the clock signal C. Thus, two OR gates 49, 50 and one AND gate 51 are required. The complement $\overline{C}$ is effectively generated by the IFL circuitry as shown by the circled input on OR gate 50 and as described above with respect to FIGS. 1 and 2. In the ECL implementation of FIG. 3, AND gate 48 requires collector dotting and may require the use of a diode clamp which would slow down latch operation and require an additional component. The circuit implementation of the IFL circuit of FIG. 4 is shown in FIG. 5. Here, the IFL embodiment of the type shown in FIG. 1 is utilized wherein a level shifted representation C' of the input C is obtained by dropping the voltage available on the emitter of transistor 53 of the previous gate 52 across resistor 54. This level shifted representation C' of the input C is introduced to the base of level shift input transistor 59 thereby effectively introducing the complement C into the logical operation to produce the outut $Z=(D+C)(Z+\overline{C})$. The input C is applied to the base of transistor 56, the other input variable D is impressed on the base of transistor 57 and the standard reference voltage $V_{BB}$ is introduced to the base of transistor 58. This reference voltage $V_{BB}$ is available in all ECL circuits and typically has a value midway between the values for a logic 1 and a logic 0, i.e., at a level of about $-1.3$ volts since the acceptable levels for a logic 1 is a pass band of about $-0.7$ volts to about $-1.001$ volts and an acceptable voltage for a logic 0 is a pass band of about $-1.635$ volts to about $-1.850$ volts. The value for C' is shifted about 0.4 volts below that for C, so that when C is low and current flows through transistor 58 (assuming also that D is low) then C will be still lower so that no current flows through transistor 59 to produce excessive current through resistor 67, i.e., the current from current sources 65 and 66 will never pass at the same time through resistor 67. Thus, there is no need for a diode clamp across resistor 67.

Figures 6A, 6B, 6C, 6D:
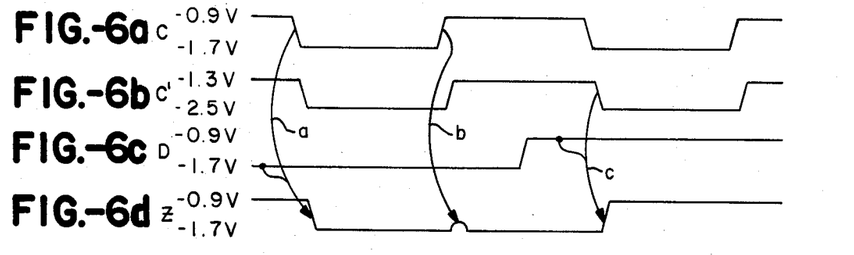
FIGS. 6a–6d are timing diagrams of the voltages on the critical nodes within the circuit of FIG. 5.

The operation of the latch of FIGS. 3 and 4 is in accordance with known latch principles. Briefly, when the clock signal C is high, the output Z holds the state previously supplied on the data input D. When the clock input C is low, the latch is in a sample mode and the state of the output Z is that presently available on D. This functionality is shown in the timing diagrams of FIGS. 6a–6d. Thus, even tnough the data input D experiences a low-to-high transistion as shown in FIG. 6c, this is not reflected on the output Z until the clock signal and the associated level shifted representation C' go low as shown in FIGS. 6a, 6b and 6d and as highlighted by the downwardly facing arrow c. This is also reflected in the fact that the output Z is initially high (even though the data input is low) until the clock input goes low to sample the low current data signal. This causal relationship is indicated by the downwardly facing line a. A problem with such an In-Phase Latch is that as the clock input goes high again, there is a glitch formed in the output Z. This glitch is not a problem unless it totally changes the state to produce an error downstream. The causative relationship for the glitch is shown in b.

Out-of-Phase Latch Circuit

Figure 7:
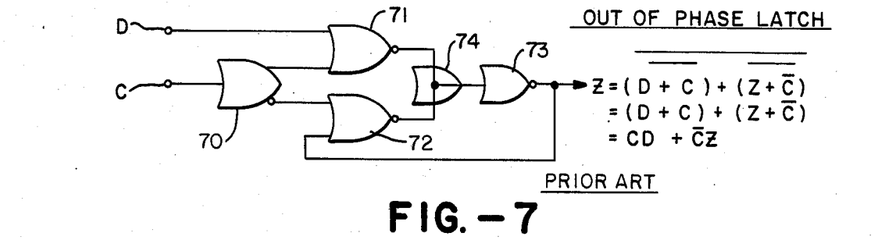
FIG. 7 is an Out-of-Phase Latch circuit implemented with ECL logic gates of the prior art.
Figure 8A:
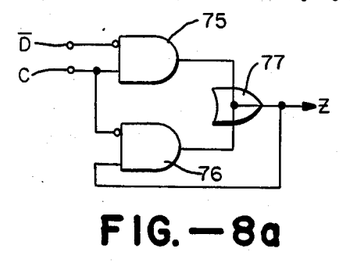
FIG. 8a is an Out-of-Phase Latch circuit implemented with IFL gates.
Figure 8B:
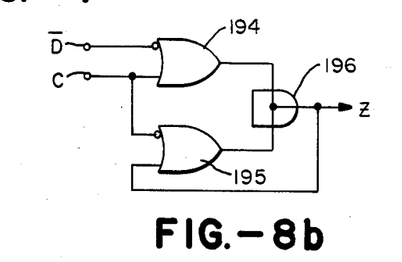
FIG. 8b is another version of an Out-of-Phase Latch circuit implemented with IFL gates.

An Out-of-Phase Latch circuit implemented with ECL components is shown in FIG. 7. Here, five OR gates 70, 71, 72, 73 and 74 are required. The OR gate 74 requires an emitter dot as shown by the dotted intersection in the interior of the symbol. The two inputs are data, D, and clock, C. The output is given by $Z=(C+D)(\overline{C}+Z)$, the same output Z is produced by the In-Phase logic diagram of FIG. 3. The designation "out-of-phase" stems from the availability of an out-of-phase output $\overline{Z}$ on the output of OR gate 74. Two different IFL-based implementations of the Out-of-Phase Latch are shown in FIGS. 8a and 8b, respectively. In the embodiment of FIG. 8a two AND gates 75 and 76 and one OR gate 77 are utilized; in the embodiment of FIG. 8b two OR gates 194 and 195 and one AND gate 196 are utilized. Both implementations produce a savings of two gates. One of these gates is OR gate 70 since, as noted previously, the IFL embodiments eliminate the need for the gate which produces the complement of the clock input.

Figure 9:
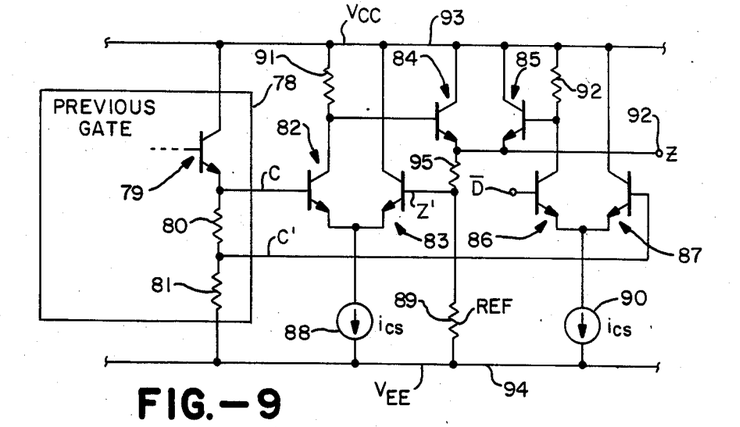
Figures 10A, 10B, 10C, 10D:
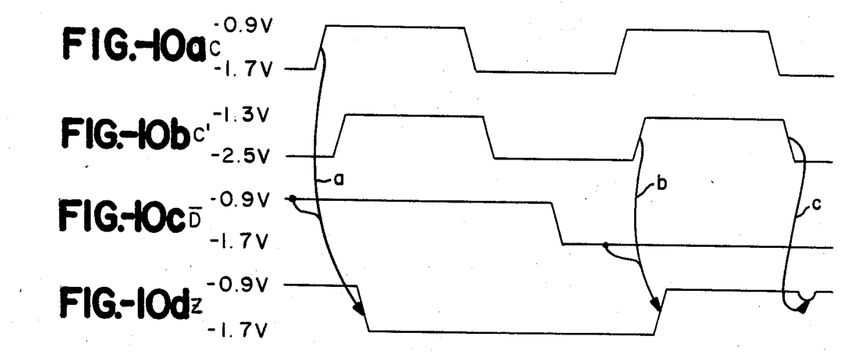
FIGS. 10a–10d are timing diagrams of the voltages on the the critical nodes within the circuit of FIG. 9.

The circuit schematic of the logic diagram of FIG. 8a is shown in FIG. 9. Here, the output transistor 79 from the previous gate 78 provides an input C to the base of input transistor 82. The voltage level on the emitter of output transistor 79 is dropped across resistor 80 to produce a level shifted representation C' of the output C. Typically, this will be about 0.4 volts shifted below the level of C. The voltage C' is raised above the level of $V_{EE}$ by the voltage drop across resistor 81. Current source 88 is connected between the common coupled emitters of transistors 82 and 83 and the low potential $V_{EE}$ line 94; current source 90 is connected to the common coupled emitters of transistors 86 and 87 and the low potential $V_{EE}$ line 94. The feedback of the output Z to the input of AND gate 76 is obtained by applying the level shifted voltage Z' to the base of transistor 83 through resistor 95. When the clock signal goes from a low to high level, the output of the latch changes to the complement of the current data state. This event is shown by the downwardly trending lines a and b which highlight the changes in FIGS. 10a, 10b and 10d. This state is retained in the output Z since D does not change while C is still high. Finally, when the level shifted representation C', shown in FIG. 10b, of the clock signal C, shown in FIG. 10a, goes low there is a potential glitch in the output state. This is shown by the downwardly trending line c. This causes no problem unless the glitch is so deep that the output reaches a state fully opposite to the correct state thereby providing incorrect information.

Latch With Scan-In, Scan-Out

The principle of scan-in, scan-out is well known in computer technology. Scan-in allows any one of a number of latches to be asynchronously set to a high or low state. Scan-out allows any one of a number of latches to be asynchronously interrogated as to its state. To accomplish scan-in and scan-out, extra signals comprising scan addresses, scan-in data, scan-out data and reset data must be provided at the latch. A prior art ECL latch with the property of scan-in, scan-out is shown in FIG. 11. Here, six OR gates 100, 101, 102, 103, 104 and 105 are utilized to produce the output $Z=(C+D)(\overline{C}+R+Z)(SID+SA1+SA2)$ where R is the reset input, SA1 and SA2 are the scan address inputs, and SID is the scan-in data.

FIG. 12 shows the logic diagram of a scan-in, scan-out latch implemented in IFL. Note that only four gates 106, 107, 108 and 109 are required.

Figure 13:
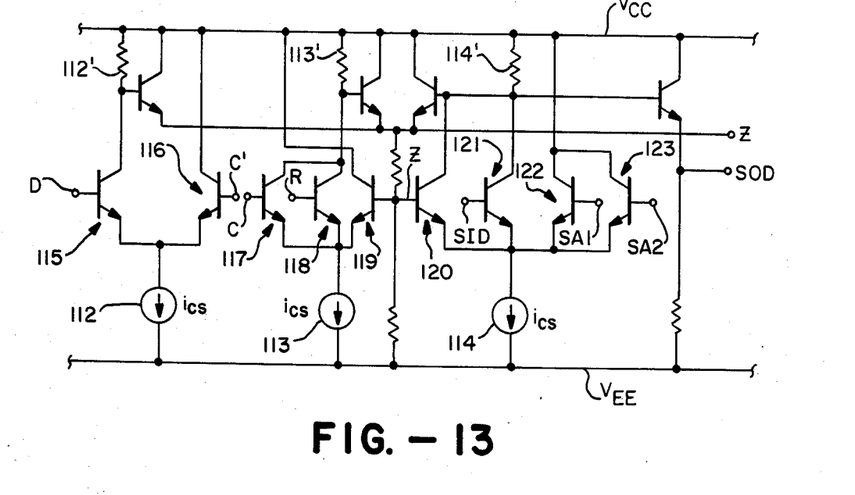
FIG. 13 is the circuit schematic of the Scan-in, Scan-out latch of FIG. 12.

In FIG. 13 the circuit schematic for the IFL implementation of the scan-in, scan-out of FIG. 2 is shown. A level shifted representation C' of the clock signal C is provided on the base of level shift input transistor 116 and a level shifted representation Z' of the output Z is provided on the bases of transistors 119 and 120. Due to the organization of the circuit on IFL principles, the current from current sources 112, 113 and 114 will only pass through the respective resistors 112', 113' and 114'; the current from two sources will not pass through the same resistor at the same time.

Figure 14:
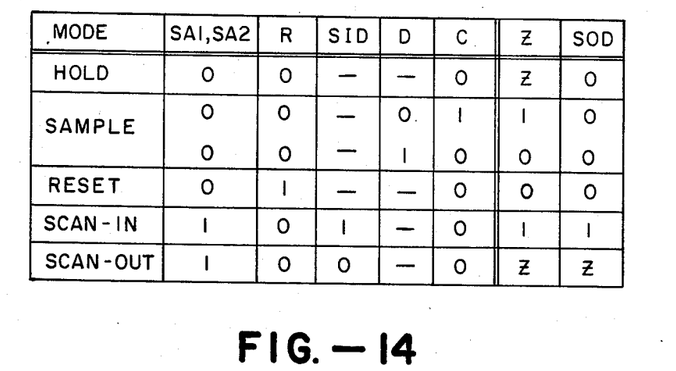
FIG. 14 is a truth table of the IFL-based latch of FIGS. 12 and 13.

In FIG. 14 the truth table for the latch of FIGS. 12–13 is given. Note that in the hold mode, the output Z retains its previous state regardless of the state of input data D. In the sample mode, the output Z is the complement of the input data D. In the reset mode, the output Z is reset to a "0" level. In the scan-in mode, with both scan address inputs SA1 and SA2 low and scan-in data SID high, the output Z is set to high or "1" level. In the scan-out mode, the scan-out data SOD follows the state of the output Z.

Master/Slave Latch

Figure 15:
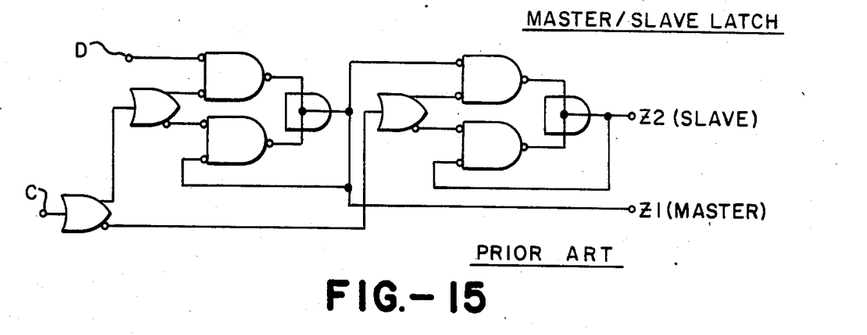
FIG. 15 is the logic diagram of a Master/Slave latch implemented with ECL logic.

A Master/Slave latch of the prior art that is implemented in ECL circuitry is shown in FIG. 15. Here, three OR/NOR gates 124, 127 and 129 are utilized along with six gates 125, 126, 128, 130, 131 and 132. The output Z1 is a master and Z2 is a slave in accordance with conventional master/slave latch operation. See, e.g., *Bistable Logic Design*, pp. 8–10 (McGraw-Hill 1978). In contrast, the master/slave latch is implemented in IFL logic with five gates 135, 136, 137, 138 and 139. The OR gate 137 utilizes emitter dotting and the AND gate 139 utilizes collector dotting. However, as discussed below, this collector dotting is not harmful because no diode clamps are required to protect against the channeling of all current through a particular resistor. With the collector dotting in AND gates 128 and 132 of FIG. 15 such diode clamps may have been required.

Figure 16:
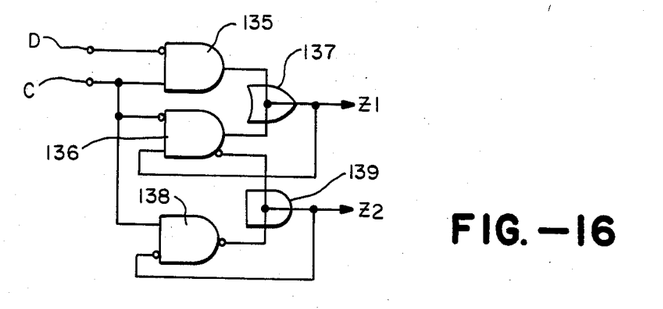
FIG. 16 is the logic diagram of a Master/Slave latch implemented with IFL logic gates.
Figure 17:
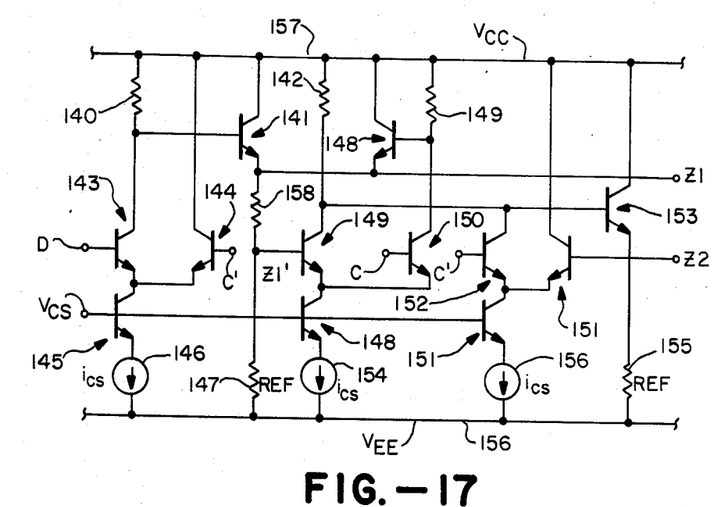
FIG. 17 is a circuit schematic of the IFL-based logic of FIG. 16.
Figures 18A, 18B, 19A, 19B:
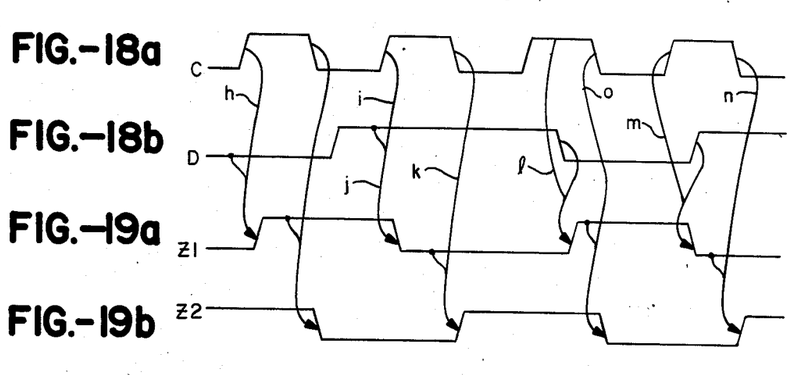
FIGS. 18a–18b and 19a–19b are timing diagrams of the critical nodes of the Master/Slave latch of FIGS. 16–17.

The circuit implementation of the master/slave latch of FIG. 16 is shown in FIG. 17. The C and D inputs are the same as those provided for the prior art logic diagram of FIG. 15. In addition, level shifted representations of signal C are required and are introduced on the bases of level shifted input transistors 144 and 152. The ECL level input for C is introduced on the base of input transistor 150; and the ECL-based level for the variable D is introduced on the base of input transistor 143. The collector dotting of AND gate 139 occurs on the collectors of transistors 149 and 152. By the inherent nature of operation, the current through current source 156, and transistor 152 will never pass through resistor 142 at the same time as the current through current source 154 and transistors 148 and 149. Thus, there is no need of a diode clamp across resistor 142 to protect it from excessive currents. The timing diagrams for the master/slave latch are shown in FIGS. 18a–18d. The clock signal C is shown in FIG. 18a as having a regular periodicity. The data signal D is shown in FIG. 18b as occurring in accordance with the impression of data. When the clock C goes high, the master latch enters its sample mode of operation and its output Z1 follows the complement of the input data D. This is indicated by the downwardly extending lines h and j. When the clock C goes low, the slave latch enters its sample mode of operation and its output Z2 follows the complement of the master output Z1. This is indicated by the lines i and k. If the input data changes when the clock C is high, then output Z1 will also change, but in a complementary direction. This is indicated by the downwardly extending lines l and m. However, the output Z2 will not respond to the change in Z1 until the clock C goes low, as indicated by downwardly extending lines n and o.

It is noteworthy that the IFL implementation of the master-slave latch only requires three current sources, for the gates 135, 136 and 138 shown in FIG. 16, whereas the ECL implementation of the master-slave latch requires separate current sources for each of the gates 129, 127, 125, 126, 124, 130 and 131 shown in FIG. 15, for a total of seven current sources. This is a good example of the savings in circuitry and power consumption that can be achieved with IFL implementations as compared to ECL implementations of the same sequential logic function.

Glitch-Free Latch Circuit

Figure 20:
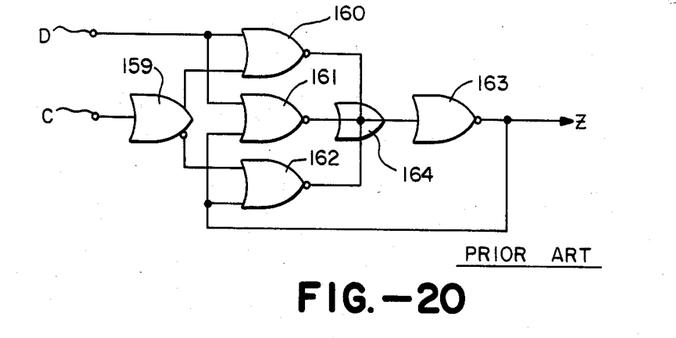
FIG. 20 is a logic diagram of a Glitch-Free Latch circuit implemented with ECL gates.
Figure 21:
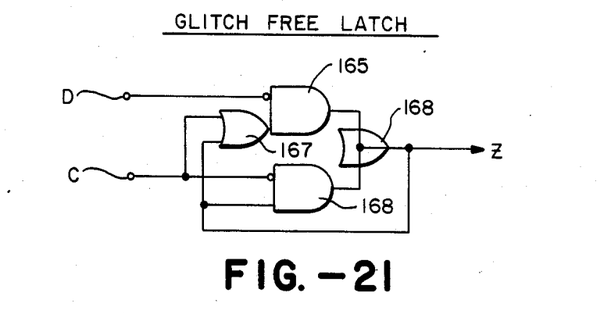
FIG. 21 is a Glitch-Free Latch circuit implemented with IFL gates.
Figure 22:
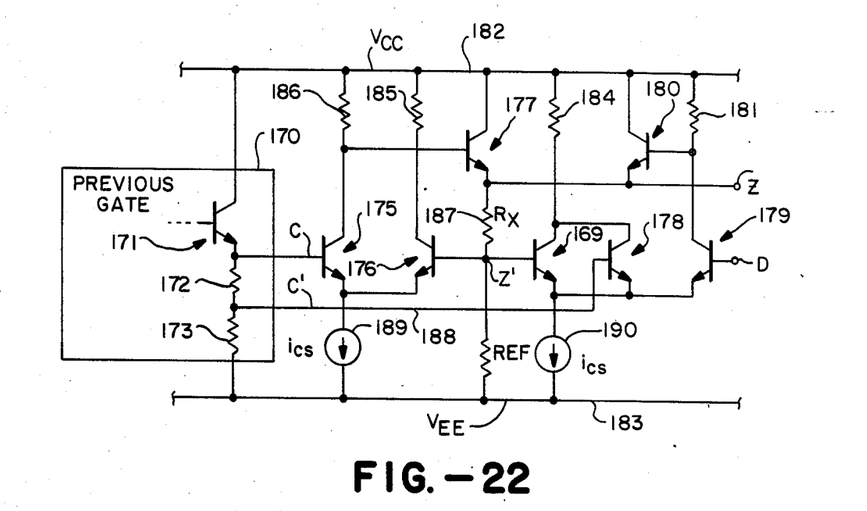
FIG. 22 is a circuit schematic of the IFL-based Glitch-Free Latch circuit of FIG. 21 based on the IFL embodiment of FIG. 1.

A Glitch-Free Latch circuit implemented with prior art ECL circuitry is shown in FIG. 20. Here, six gates 159, 160, 161, 162, 163 and 164 are utilized. From the inputs D and C the output $Z=(D+C)(D+Z)(\overline{C}+Z)$ is obtained. With the IFL-based implementation of the glitch-free latch circuit, four gates 165, 166, 167 and 168 are used, as shown in FIG. 21. The output $Z=\overline{D}(C+Z)+Z\overline{C}$ is obtained. FIG. 22 shows the circuit schematic for one embodiment of the IFL implementation of the glitch-free latch. Level shifted input signals C' and Z' are provided, respectively, at the bases of level shift input transistor 178 and level shift input transistors 169 and 176. Only two current sources are required for this implementation, versus five current sources for the ECL implementation, i.e., one for each of the gates 159, 160, 161, 162 and 163, of FIG. 20.

Figure 22A:
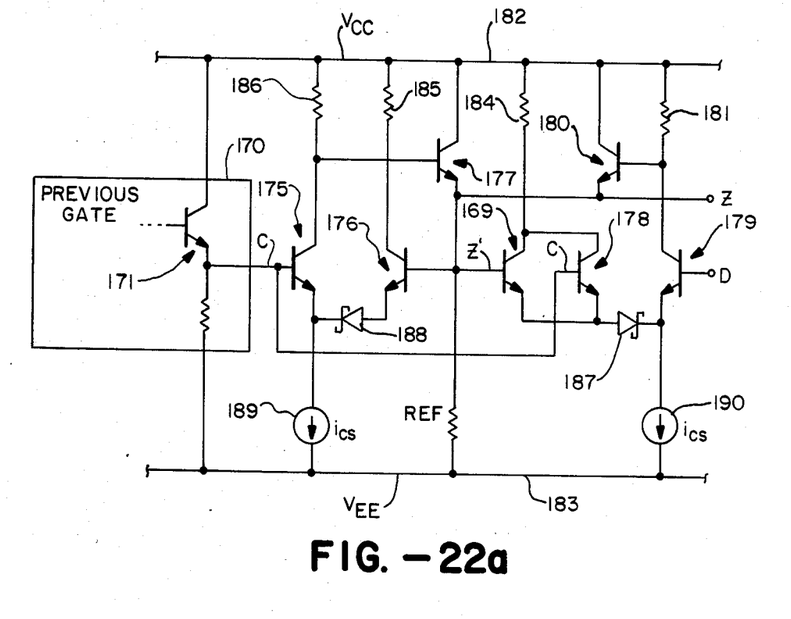
FIG. 22a is a circuit schematic of the Glitch-Free Latch circuit of FIG. 21 based on the IFL embodiment of FIG. 2.
Figure 23A:
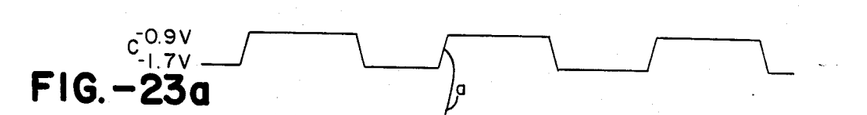
FIGS. 23a–23d are timing diagrams of the voltages on the critical nodes for the Glitch-Free Latch circuits of FIGS. 21–22.
Figure 23B:
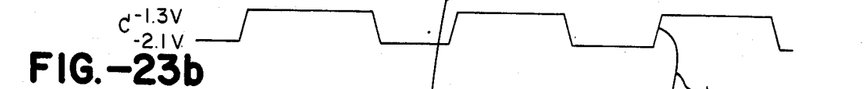
Figure 23C:
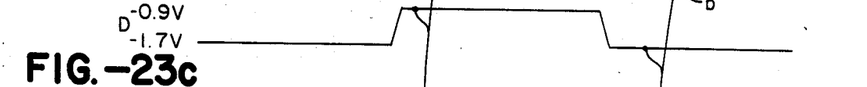
Figure 23D:
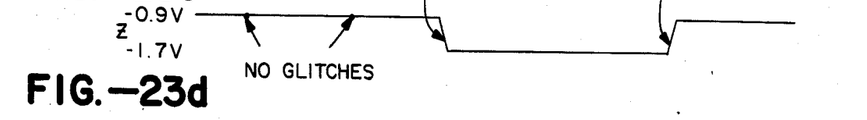

An alternate circuit implementation for the glitch-free latch circuit of FIG. 21 is shown in FIG. 22a. Here, Schottky diodes 187 and 188 are included on the emitters of transistors 178 and 176, respectively. Logical operation of the glitch-free latch circuit is the same as that described above without the need to generate the level shifted signals C' and Z'. As with the embodiment of FIG. 22, there is no need to protect resistors 181, 186 or 185 with diode clamps.

The timing diagrams for the operation of the IFL-based glitch-free latch circuits of FIGS. 21–23 is shown in FIGS. 23a–23d. The latch enters a sample mode when the clock signal (C and C') goes high. Thus output Z goes low (for a high input D) for the events denoted by downwardly extending line a, and output Z goes high (for a low input D) for the events denoted by downwardly extending line b. Due to the added functional complexity of this latch (compare FIG. 21 to FIG. 7), the possibility of a glitch in the output Z is completely eliminated, as noted in the timing diagram of FIG. 23d.

The foregoing description of preferred embodiments of the invention have been presented for purposes of illustration and description. It is not intended to be exhaustive or to limit the invention to the precise form disclosed, as obviously many other sequential logic functions can be implemented with IFL gates. The embodiments were chosen and described in order to best explain the principles of the invention and its practical application to thereby enable others skilled in the art to best utilize IFL principles in various embodiments of sequential logic functions and with various modifications as are suited to the particular use contemplated. It is intended that the scope of the invention be defined by the claims appended hereto.

What is claimed is:

1. A bipolar gate sequential logic circuit comprising:
   at least one data input transistor means including a base coupled to receive a data signal and including a collector coupled to a supply potential, $V_{CC}$;
   at least one clock input bipolar transistor means including an emitter coupled to an emitter of said at least one input transistor means, a base coupled to receive a clock signal and a collector coupled to the supply potential, $V_{CC}$;
   at least one reference bipolar transistor means including an emitter coupled to said emitters of said at least one data input transistor means and said at least one clock input transistor means, including a base coupled to a reference voltage, $V_{DD}$, substantially at a center of a passband for said at least one data input transistor means and for said at least one clock input transistor means and including a collector coupled to the supply potential, $V_{CC}$, through a first resistor means;
   at least one level shift bipolar transistor means including a collector coupled to a collector of said at least one reference bipolar transistor means and to the supply potential, $V_{CC}$, through the first resistor means, and including a base coupled to receive a level shifted representation of said clock signal;
   at least one fifth bipolar transistor means including an emitter coupled to an emitter of said at least one level shift bipolar transistor means, including a collector coupled to the supply potential, $V_{CC}$, and including a base coupled through a second resistor means to a low potential, $V_{EE}$;
   first current source means coupled to respective emitters of said at least one input data transistor means, of said at least one clock input transistor means, and of said at least one reference transistor means;
   second current source means coupled to respective emitters of said at least one level shift transistor means and of said at least one fifth transistor means;
   output bipolar transistor means including a collector coupled to the supply potential, $V_{CC}$, a base coupled to respective collectors of said at least one reference transistor means and of said at least one level shift bipolar transistor means and including an emitter coupled through the second resistor means to a low potential, $V_{EE}$; and
   output signal providing means coupled between the emitter of said output bipolar transistor means and said second resistor means for providing an output signal.

2. A latch circuit comprising:
   at least one data input transistor means including a base coupled to receive a data signal;
   at least one clock input bipolar transistor means including a base coupled to receive a clock signal;
   at least one third bipolar transistor means including an emitter coupled to an emitter of said at least one clock input transistor means;
   at least one level shift bipolar transistor means including an emitter coupled to an emitter of said at least one data input transistor means and including a base coupled to receive a level shifted representation of said clock signal;
   at least one first emitter follower bipolar trasnsitor means including a base coupled to a collector of said at least one data input transistor means and including a collector coupled toa supply voltage, $V_{CC}$,
   at least one second emitter follower bipolar transistor means including a base coupled to a collector of said at least one clock input transistor means, including a collector coupled to a supply voltage, $V_{CC}$, and including an emitter coupled to an emitter of said at least one first emitter follower transistor means;
   first current source means coupled between respective emitters of said at least one clock input transistor means and of said at least one third transistor means and a low potential, $V_{EE}$;
   second current source means coupled between respective emitters of said at least one data input transistor means and of said at least one level shift transistor means and said low potential, $V_{EE}$;
   first resistor means coupled between said emitter of said at least one second emitter follower transistor means and said base of said at least one third transistor means;
   second resistor means coupled between said base of said at least one third transistor means and said low potential, $V_{EE}$;
   third resistor means coupled between said base of said at least one second emitter follower transistor means and a supply potential, $V_{CC}$;
   fourth resistor means coupled between said base of said at least one first emitter follower transistor means and said supply potential, $V_{CC}$; and
   output signal providing means, coupled to said respective emitters of said at least one first emitter follower transistor means and said at least one second emitter follower transistor means, for providing an output signal.

3. A latch circuit comprising:
   at least one data input transistor means including a collector coupled through a first resistor means to a supply potential, $V_{CC}$, and including a base coupled to receive a data signal;
   at least one second bipolar transistor means including an emitter coupled to an emitter of said at least one data input transistor means and including a base coupled to receive a level shifted representation of a clock signal;
   first current source means coupled between said respective emitters of said at least one data input transistor means and of said at least one second transistor means and a low potential, $V_{EE}$;
   at least one clock input bipolar transistor means including a base coupled to receive a clock signal and including a collector coupled through a second resistor means to the supply potential, $V_{CC}$;
   at least one reset bipolar transistor means including a base coupled to receive a reset signal and including a collector coupled to a collector of said at least one clock input transistor means;

at least one first level shift bipolar transistor means including a collector coupled to the supply potential, $V_{CC}$;

second current source means coupled between respective emitters of said at least one clock input transistor means, said at least one reset transistor means and said at least one first level shift transistor means and the low potential, $V_{EE}$;

at least one scan-in bipolar transistor means including a base coupled to receive a scan-in signal and including a collector coupled through a third resistor means to the supply voltage, $V_{CC}$;

at least one first scan address bipolar transistor means including a base coupled to receive a first scan address signal and including a collector coupled to the supply voltage, $V_{CC}$;

at least one second level shift bipolar transistor means including a base coupled to a base of said at least one first level shift transistor means;

at least one second scan address bipolar transistor means including a base coupled to receive a second scan address signal and including a collector coupled to the supply potential, $V_{CC}$;

third current source means coupled between respective emitters of said at least one second level shift transitor means, of said at least one scan-in transistor means, of said at least one first scan address transistor means and of said at least one second scan address transistor means and the low potential, $V_{EE}$;

at least one third bipolar transistor means including a basee coupled to respective collectors of said at least one second level shift transistor means and of said at least one scan-in transistor means and coupled to the supply potential, $V_{CC}$, through the third resistor means, including a collector coupled to the supply potential, $V_{CC}$, and including an emitter coupled through a fourth resistor means to a low potential, $V_{EE}$;

terminal means coupled to the emitter of said at least one third bipolar transistor means for providing a scan-out data signal, at least one fourth bipolar transistor means; and at least one fifth bipolar transistor means;

wherein respective collectors of said at least one fourth transistor means and said at least one fifth transistor means are coupled to the supply potential, $V_{CC}$, and their respective emitters are coupled to an output terminal means for providing an output signal;

at least one sixth bipolar transistor means including a base coupled through the first resistor means to the supply potential, $V_{CC}$, including a collector coupled to the supply potential, $V_{CC}$, and including an emitter coupled to said output terminal means;

said at least one fourth bipolar transistor means including a base coupled through the second resistor means to the supply potential, $V_{CC}$; and said at least one fifth bipolar transistor means including a base coupled to the base of said at least one third bipolar transistor means and to the respective collectors of said at least one second level shift transistor means and of said at least one scan-in transistor means and coupled to the supply potential, $V_{CC}$, through the third resistor means.

4. A latch circuit comprising:

at least one data input bipolar transistor including a base coupled to receive a first data signal;

at least one second bipolar transistor means including a base coupled to receive a level shifted representation of a clock signal;

at least one third bipolar transistor means including a collector coupled to respective emitters of said at least one data input transistor means and of said at least one second transistor means;

first current source means coupled between an emitter of said at least one third transistor means and a low potential, $V_{EE}$;

at least one fourth bipolar transistor means;

at least one fifth bipolar transistor means including a base terminal coupled to receive a clock signal;

at least one sixth bipolar transistor means including a collector coupled to respective emitters of said at least one fourth transistor means and said at least one fifth transistor means;

second current source means coupled between an emitter of said at least one sixth transistor means and a low potential, $V_{EE}$;

at least one seventh bipolar transistor means including a base terminal coupled to receive a level shifted representation of a clock signal;

at least one eighth bipolar transistor means;

at least one ninth bipolar transistor means including a collector coupled to respective emitters of said at least one seventh transistor means and of said at least one eight transistor means and having its base coupled to the respective bases of the third and sixth transistor means and further coupled to receive a bias voltage signal.

third current source means coupled between an emitter of said at least one ninth transistor means and a low potential, $V_{EE}$;

at least one tenth bipolar transistor means including a base coupled to the collector of said at least one data input transistor;

first resistor means coupled between an emitter of said at least one tenth transistor means and a base of said at least one fourth transistor means;

second resistor means coupled between said base of said at least one fourth transistor means and a low potential, $V_{EE}$;

first conductor means coupled between an emitter of said at least one tenth transistor means and said first resistor means for providing a master signal;

at least one output transistor means including a base coupled to a collector of said at least one fourth transistor means and to a collector of said at least one seventh transistor means;

fourth resistor means coupled between a supply voltage, $V_{cc}$, and a collector of said at least one fourth transistor means;

fifth resistor means coupled between said supply potential, $V_{cc}$, and a base of said at least one twelfth transistor means;

sixth resistor means coupled between said supply potential, $V_{cc}$, and a base said at least one tenth transistor means;

a collector of said at least one fifth transistor means is coupled to a base of said at least one twelfth bipolar transistor means; and second conductor means coupled to a base of said at least one eigth transistor means and to an emitter of said at least one output transistor means for providing a slave signal.

5. A latch circuit comprising:
at least one first bipolar transistor means including a base for receiving a clock signal;
at least one second bipolar transistor means;
first current source means coupled between respective emitters of said at least one first transistor means and said at least one second transistor means and a low potential, $V_{EE}$;
at least one third bipolar transistor means;
at least one fourth bipolar transistor means including a base coupled to receive a level shifted representation of said clock signal;
at least one fifth bipolar transistor means including a base coupled to receive a data signal;
second current source means coupled between respective emitters of said at least one third transistor means, said at least one fourth transistor means and said at least one fifth transistor means and a low potential, $V_{EE}$;
at least one sixth bipolar transistor means;
first resistor means coupled between an emitter of said at least one sixth transistor means and the respective bases of said at least one second transistor means and at least one third transistor means;
second resistor means coupled between said first resistor means and a low potential, $V_{EE}$;
at least one seventh bipolar transistor means including a base coupled to the collector of said at least one fifth transistor means and including an emitter coupled to an emitter of said at least one sixth transistor means;
a collector of said at least one third transistor means is coupled to a collector of said at least one fourth transistor means;
third resistor means coupled between respective collectors of said at least one respective third transistor means and of said at least one fourth transistor means and a supply potential, $V_{cc}$;
fourth resistor means coupled between a supply potential, $V_{cc}$ and a collector of said at least one first transistor means;
fifth resistor means coupled between a collector of said at least one second transistor means and a supply potential, $V_{cc}$;
sixth resistor means coupled between a supply potential, $V_{cc}$ and said base of said at least one seventh transistor means; and
first conductor means coupled to respective emitters of said at least one sixth transistor means and said at least one seventh transistor means for providing an output signal.

6. A latch circuit comprising:
at least one first bipolar transistor means including a base for receiving a clock signal;
at least one second bipolar transistor means;
at least one first Schottky diode means including an anode coupled to an emitter of said at least one second transistor means and a cathode coupled to an emitter of said at least one first transistor means;
first current source means coupled between said cathode of said at least one first Schottky diode means and the emitter of said at least one first transistor means and a low potential, $V_{EE}$;
at least one third bipolar transistor means;
at least one fourth bipolar transistor means including a base coupled to receive said clock signal;
at least one fifth bipolar transistor means including a base coupled to receive a data signal;
at least one second Schottky diode means including an anode coupled to respective emitters of said at least one third and said at least one fourth transistor means and a cathode coupled to the emitter of said at least one fifth transistor means;
second current source means coupled between said cathode of said at least one second Schottky diode means and a low potential, $V_{EE}$,
at least one sixth bipolar transistor means;
first resistor means coupled between respective bases of said at least one second transistor means and said at least one third transistor means on one side and a low potential, $V_{EE}$, on another side;
at least one seventh bipolar transistor means including a base coupled to the collector of said at least one fifth transistor means and including an emitter coupled to an emitter of said at least one sixth transistor means;
a collector of said at least one third transistor means is coupled to a collector of said at least one fourth transistor means;
second resistor means coupled between respective collectors of said at least one respective third transistor means and of said at least one fourth transistor means an a supply potential, $V_{cc}$;
third resistor means coupled between a supply potential, $V_{cc}$, and a collector of said at least one first transistor means;
fourth resistor means coupled between a collector of said at least one second transistor means and a supply potential, $V_{cc}$;
fifth resistor means coupled between a supply potential, $V_{cc}$, and said base of said at least one seventh transistor transistor means; and
first conductor means coupled to respective emitters of said at least one sixth transistor means and said at least one seventh transistor means for providing an output signal.

* * * * *

UNITED STATES PATENT AND TRADEMARK OFFICE
CERTIFICATE OF CORRECTION

PATENT NO. : 4,675,553

DATED : June 23, 1987

INVENTOR(S) : Price and DeClue

It is certified that error appears in the above-identified patent and that said Letters Patent is hereby corrected as shown below:

Column 9, line 29: "...voltage, $V_{DD}$," should be "voltage, $V_{BB}$,"

Signed and Sealed this

Thirteenth Day of December, 1988

Attest:

DONALD J. QUIGG

*Attesting Officer*  *Commissioner of Patents and Trademarks*